United States Patent [19]
Haider et al.

[11] Patent Number: 6,072,342
[45] Date of Patent: Jun. 6, 2000

[54] TIMED ONE-SHOT ACTIVE TERMINATION DEVICE

[75] Inventors: Nazar S. Haider, Fremont; Srinivasan Rajagopalan, Palo Alto, both of Calif.

[73] Assignee: Intel Corporation, Santa Clara, Calif.

[21] Appl. No.: 08/907,933

[22] Filed: Aug. 11, 1997

[51] Int. Cl.$^7$ .......................... H03K 3/00; H03K 19/094
[52] U.S. Cl. ............................................................ 327/112
[58] Field of Search ................................... 327/108, 112, 327/427, 434, 437, 227; 326/81–87, 90–91

[56] References Cited

U.S. PATENT DOCUMENTS

| | | | |
|---|---|---|---|
| 5,479,111 | 12/1995 | Matsuura | 326/24 |
| 5,604,454 | 2/1997 | Maguire et al. | 327/112 |
| 5,617,043 | 4/1997 | Han et al. | 326/83 |
| 5,670,905 | 9/1997 | Keeth et al. | 327/333 |
| 5,723,992 | 3/1998 | Yin et al. | 327/112 |
| 5,751,160 | 5/1998 | Baek et al. | 326/27 |
| 5,760,634 | 6/1998 | Fu | 327/391 |
| 5,793,226 | 8/1998 | Park et al. | 326/86 |

*Primary Examiner*—My-Trang Nu Ton
*Attorney, Agent, or Firm*—Leo Novakoski

[57] ABSTRACT

A circuit for driving GTL-type buses actively drives a bus trace towards a first reference voltage when a signal in a first voltage state is detected at its input and actively drives the bus trace towards a second reference voltage for a selected period when the signal at its input transitions from the first voltage state to a second voltage state. The circuit includes a flip-flop for storing the sequential voltage states of the signal, logic for comparing the current voltage state of the signal with a replica of the preceding voltage state of the signal, and first and second transistors of complementary conductivity types, for driving the bus trace to first or second reference voltages, respectively, when activated. The first transistor is turned on when the signal is in the first voltage state. The second transistor is turned on for a period determined by the clock signal driving the flip flop, the type of flip-flop, and, optionally, additional logic gates, when the signal transitions from the first voltage state to the second voltage state.

21 Claims, 8 Drawing Sheets

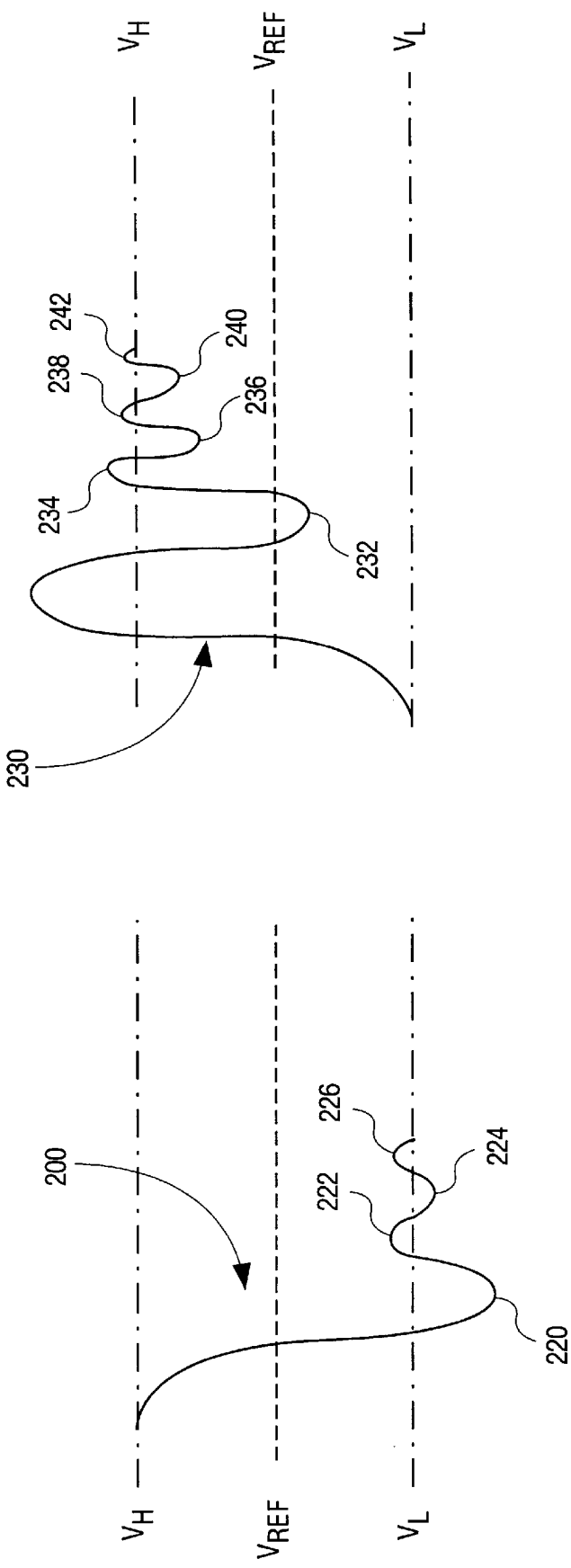

TIMED ONE-SHOT ACTIVE TERMINATION DEVICE

BACKGROUND OF THE INVENTION

1. Technical Field

The present invention relates to the field of electronic devices and, in particular, to electronic devices for driving signals onto bus traces.

2. Related Art

Modern processors can operate at core frequencies in excess of 200 MHz. In order to take advantage of these high core frequencies, computer systems must be able to transmit signals among their components at roughly comparable frequencies. Preferably, the signal buses used to transmit these signals operate at frequencies that are a third or more of the processor frequency. At high frequencies, bus traces behave like transmission lines, where impedance mismatches lead to signal reflection and interference effects. These effects distort rapidly slewing signals and are compounded by the trend to operate computers at lower system voltages. The lower operating frequencies of buses relative to those of processors are due in part to these factors.

Increasing processor speeds are widening the disparity between core (processor) and bus frequencies, increasing the likelihood that a processor will be idled by bottlenecks on its associated buses. The impact of this frequency mismatch is particularly evident in multiprocessor systems, where more than one device operates at high frequency, and the activities of these devices must be coordinated through bus signals. For example, currently available systems based on the Pentium™ and Pentium Pro™ processors of Intel Corporation have core frequencies on the order of 200 MHz and employ a 66 MHz front side bus for communications among the processors, chip set logic, and cluster logic. The next generation of processors will operate at frequencies approaching 300 MHz or more. A 66 MHz bus will be inadequate for communicating data among such fast processors. Bus frequencies on the order of 100 MHz or more will be necessary to fully support the performance advantages of these processors.

The limitations of currently available bus systems are illustrated by the front side bus currently used in the Pentium Pro system. This bus is a modification of the Gunning Transceiver Logic (GTL) bus and is referred to as the GTL+ bus. The GTL+ bus is an open drain bus that includes RC elements for slew rate control and pull up resistors to a termination voltage. The terminating resistors are selected to match the impedance of the bus trace and the stubs used to connect devices, e.g. processors, to the bus. The stubs are typically not terminated and their presence makes it difficult to estimate the trace impedance. These factors make impedance matching difficult and exacerbates noise problems at higher frequencies.

In systems employing GTL-type buses, processors on the front side bus assert selected signals by driving a zero onto the corresponding trace, i.e. these signals are asserted low. An N-channel transistor driven by the processor actively pulls the line low when the processor asserts the signal. The terminating resistors pull the trace high when the processor ceases to assert the signal. At higher frequencies, the active pull-down N-channel transistor keeps high to low voltage transitions relatively clean. However, the passive pull-up action provided by the terminating resistors allows signals to undergo substantial ringing and signal distortion on low to high voltage transitions. The terminating voltage and other parameters of the system constrain any solutions that are required to retain compatibility with the current front side bus. For example, CMOS push-pull drivers provide relatively clean signals for transitions in both directions by including pull-up and pull-down transistors for driving high-going and low-going transitions, respectively. However, these transistors turn on and off according to the state of the driver and are incompatible with shared, open drain buses like GTL and GTL+.

SUMMARY OF THE INVENTION

The present invention is a system and method for driving signals on a shared, open drain bus to provide clean signal transitions without causing bus contention or introducing additional signals to the devices driving the bus.

In accordance with the present invention, a device signal is driven onto a shared, open drain trace using first and second transistors having complementary conductivity types. The first transistor is driven when the device signal is in a first logic state. The second transistor is driven for a selected period when the device signal undergoes a transition from the first logic state to a second logic state.

In one embodiment of the present invention, the driver circuit includes a state machine for driving the second transistor. The state machine receives a bus clock signal as well as a data signal from the device signal. The state machine drives the second transistor for a selected period when the data signal transitions from the first logic state to a second logic state.

BRIEF DESCRIPTION OF THE DRAWINGS

The present invention is illustrated by way of example in the following drawings in which like references indicate similar elements. These drawings disclose various embodiments of the invention for purposes of illustration only and are not intended to limit the scope of the invention.

FIGS. 2A and 2B are representations of signals undergoing high-to-low and low-to-high transitions, respectively, on the bus of FIG. 1.

DETAILED DESCRIPTION OF THE INVENTION

The following description sets forth numerous specific details to provide a thorough understanding of the invention. However, those of ordinary skill in the art having the benefit of this disclosure will appreciate that the invention may be practiced without these specific details. In other instances, well known methods, procedures, components, and circuits have not been described in detail in order to more clearly highlight the features of the present invention.

The present invention is a system and method for driving signals from a device onto shared, open drain signal traces, such as those in GTL and GTL+-type buses ("GTL buses"). Hereafter, "GTL signal traces" refers to shared, open drain signal lines that typically include RC elements for slew rate control. Similarly, "GTL buses" refers to buses that include GTL signal traces.

The present invention provides clean signal transitions at high frequencies without creating bus contention or interfering with the GTL character of the signal traces. This is accomplished by actively driving both low to high (high going) transitions and high to low (low going) transitions on the bus. In one embodiment of the invention, low-going transitions are driven actively, e.g. by a pull-down transistor, according to the logic state of the device associated with the driver, while high going transitions are driver actively for a selected period, after which the pull-up transistor is cut off. The interval before the transistor is cut-off is determined logic in the driver circuit rather than by the logic state of the device associated with the driver.

In an alternative embodiment, the pull-down transistor is cut off following a selected period while the pull-up transistor changes according to the state of the driver. Active driving provides cleaner high and low going transitions, especially at higher operating frequencies. Cutting off the driving transistor following transitions in one direction, e.g. the pull-up transistor following high going transitions, eliminates the possibility of bus contention and preserves the GTL character of the signal traces.

Figure 1:
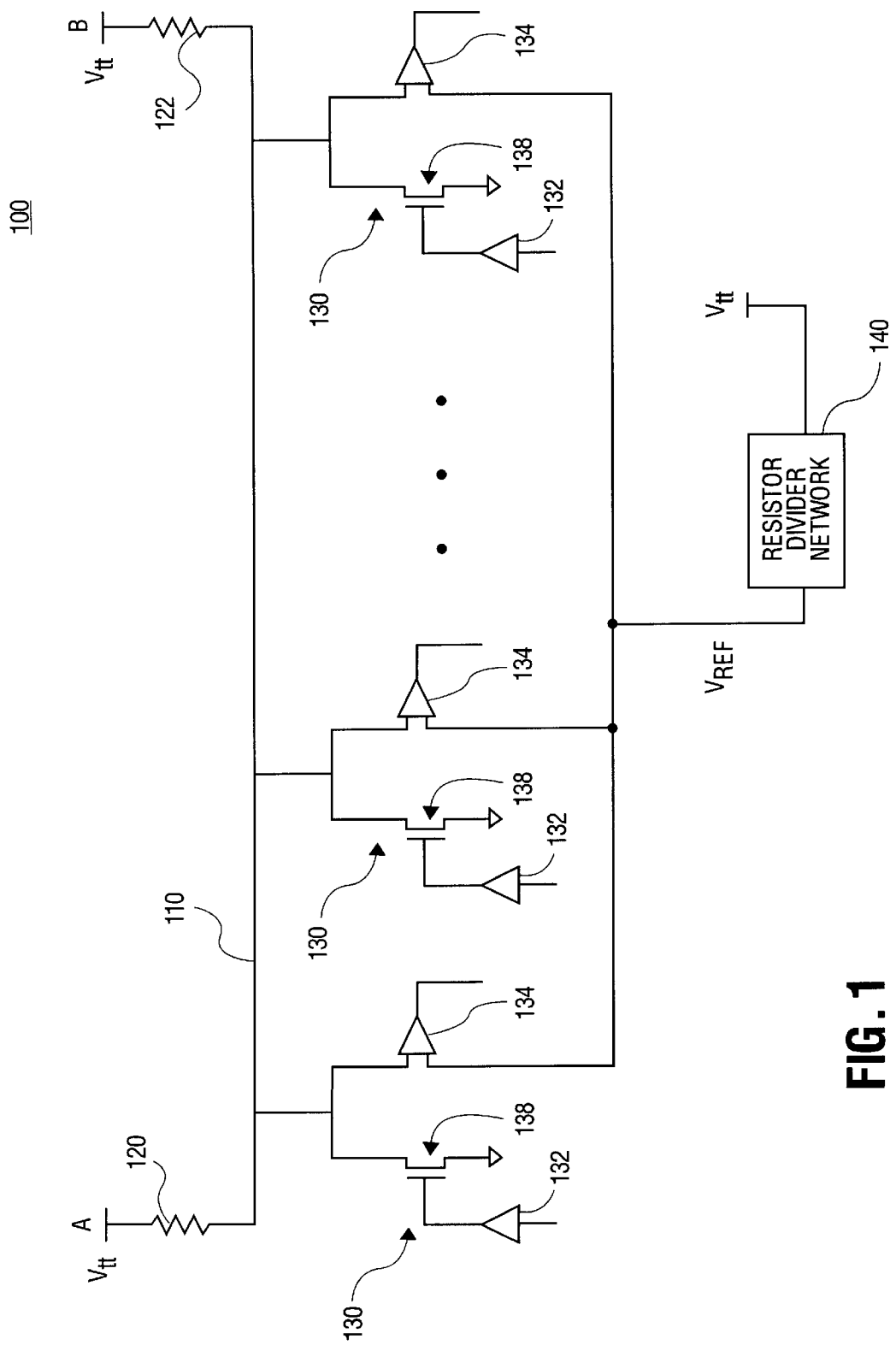
FIG. 1 is a schematic diagram of a conventional open drain bus, including passive pull-up termination resistors.

Referring first to FIG. 1, there is shown a schematic diagram of a computer system 100 based on a conventional GTL+ front side bus ("GTL bus"), as used, for example, with the Pentium Pro™ processor of Intel® Corporation. A bus trace 110 is terminated at either end to a threshold voltage ($V_{TT}$) by pull-up resistors 120, 122. Bus trace 110 is shown driven by a plurality of devices 130 through their associated drivers 132. Devices 130 may be, for example, processors, chipset logic for communicating between processors and the rest of system 100, or cluster logic for communicating between different clusters of processors. Each device 130 includes a driver 132 for asserting signals onto bus trace 110 and a receiver 134 for detecting a signal on bus trace 110. In the disclosed embodiment, driver 132 is coupled to drive the gate of an N-channel transistor 138, according to the logic state of associated device 130. In particular, transistor 138 pulls trace 110 to a low voltage state when driver 132 couples a low voltage to transistor 138, e.g when device 130 asserts a negative true signal.

In this embodiment, receiver 134 is a comparator having one input coupled to bus trace 110 and another input coupled to a reference voltage source 140. Receiver 134 determines the voltage state of a signal on bus trace 110 by comparing the voltage of the signal with the reference voltage ($V_{ref}$) provided by source 140. $V_{ref}$ is shown as being derived from $V_{TT}$ but may be provided to drivers 130 by a number of different techniques that are well known in the art. For example, $V_{TT}$ may be provided by a separate voltage supply.

Because transistors 138 in devices 130 provide active pull-down of trace 110, low going transitions are relatively clean. On the other hand, high going transitions are pulled up passively by resistors 120, 122 and $V_{TT}$. These transitions are not driven by an active pull up device to avoid the possibility of contention on bus trace 110. Bus contention arises when trace 110 is driven to different voltages by different devices 130. Here, "driven" mean that the line is actively pulled up/down by a transistor. For example, bus contention arises when a pull-up transistor of one device and a pull-down transistor of another device simultaneously drive the line to different voltage states.

Where devices 130 must arbitrate for control of a bus before asserting signals onto a trace, bus contention is eliminated since the bus trace is driven by only one device at a time. However, in many computer systems, certain bus traces may be asserted by a device without requiring the device to first arbitrate for control of the bus. Such shared lines are useful, for example, for error and snoop operations, where any device monitoring the bus signal must be able to respond if it detects a transmission error or cache hit, respectively. Open drain traces, e.g. trace 110, allow the trace sharing necessary for these operations.

In computer systems where devices 130 represent one or more Pentium Pro™ processors or their equivalents, six signals are shared, open drain signals. These signals include error signals (AERR#), transaction blocking signals (BNR#), and snoop signals (HIT#, HITM#), which may be asserted simultaneously by any of devices 130. A device 130 asserts a signal by driving its transistor 138, which pulls trace 110 low. Since resistors 120, 122 do not actively pull up trace 110, no bus contention occurs if one or more devices 130 assert shared trace 110 while others do not. One consequence of using passive pull-up resistors 120, 122 is that high going transitions are noisier than low going transitions, especially at higher frequencies.

Referring now to FIG. 2A, there is shown a schematic representation of signal 200 on bus trace 110 undergoing a transition from a high voltage state ($V_H$) to a low voltage state ($V_L$), i.e. a low going transition. When this transition occurs rapidly, i.e. at high slew rates associated with high frequency operation, signal 200 exhibits ringing about $V_L$. This ringing is represented by voltage excursions 220, 222, 224, 226.

Excursion 220 is referred to as undershoot and occurs when signal 200 is driven below the targeted voltage ($V_L$) For given trace and driver characteristics, the faster signal 200 makes the transition, the larger undershoot 220 will be. Voltage excursion 222 represents ringback, which occurs as trace 110 recovers from undershoot 220. Ringback 222 moves the voltage on trace 110 back towards its starting voltage ($V_H$). Subsequent ringing (excursions 224, 226) are increasingly damped, as signal 200 settles toward $V_L$.

Since ringback 222 moves signal 200 back towards $V_H$, a nominally low signal may be read as a high signal if the voltage excursion moves signal 200 above $V_{ref}$ when another device 130 is reading signal 200 on trace 110. Pull-down transistor 138 minimizes ringing in general and ringback 220 in particular by damping oscillations in signal 200. This stabilizes signal 200 more rapidly, allowing it to be sampled reliably soon after the low going transition.

Referring now to FIG. 2B, there is shown a schematic representation of a signal 230 in system 100 undergoing a high-going transition on bus trace 110. Signal 230 exhibits extensive ringing 232, 234, 236, 238, 240, 242. In particular, ringback 232 has a much greater amplitude than in signal 200, and ringing persists for a longer period of time. In the figure, ringback 232 is sufficient to move signal 230 back across $V_{ref}$. As a result, there may be errors in determining the logic state of signal 230 if it is read too soon after the high-going transition.

The greater amount of ringing and the larger amplitude of ringback 232 in high-going transition 230 are attributable to pull-up resistors 220, 222. Resistors 220, 222 provide weaker drive to pull bus trace 110 up to $V_{TT}$ than transistor 138 provides to pull bus trace 110 down. In addition, resistors 220,222 do not terminate trace 110 as effectively as N-channel transistor 138 does when it is activated. Since ringing generally gets worse as frequencies increase, it will be much more difficult to sample signal 230 reliably following a high going transition.

Figure 3A:
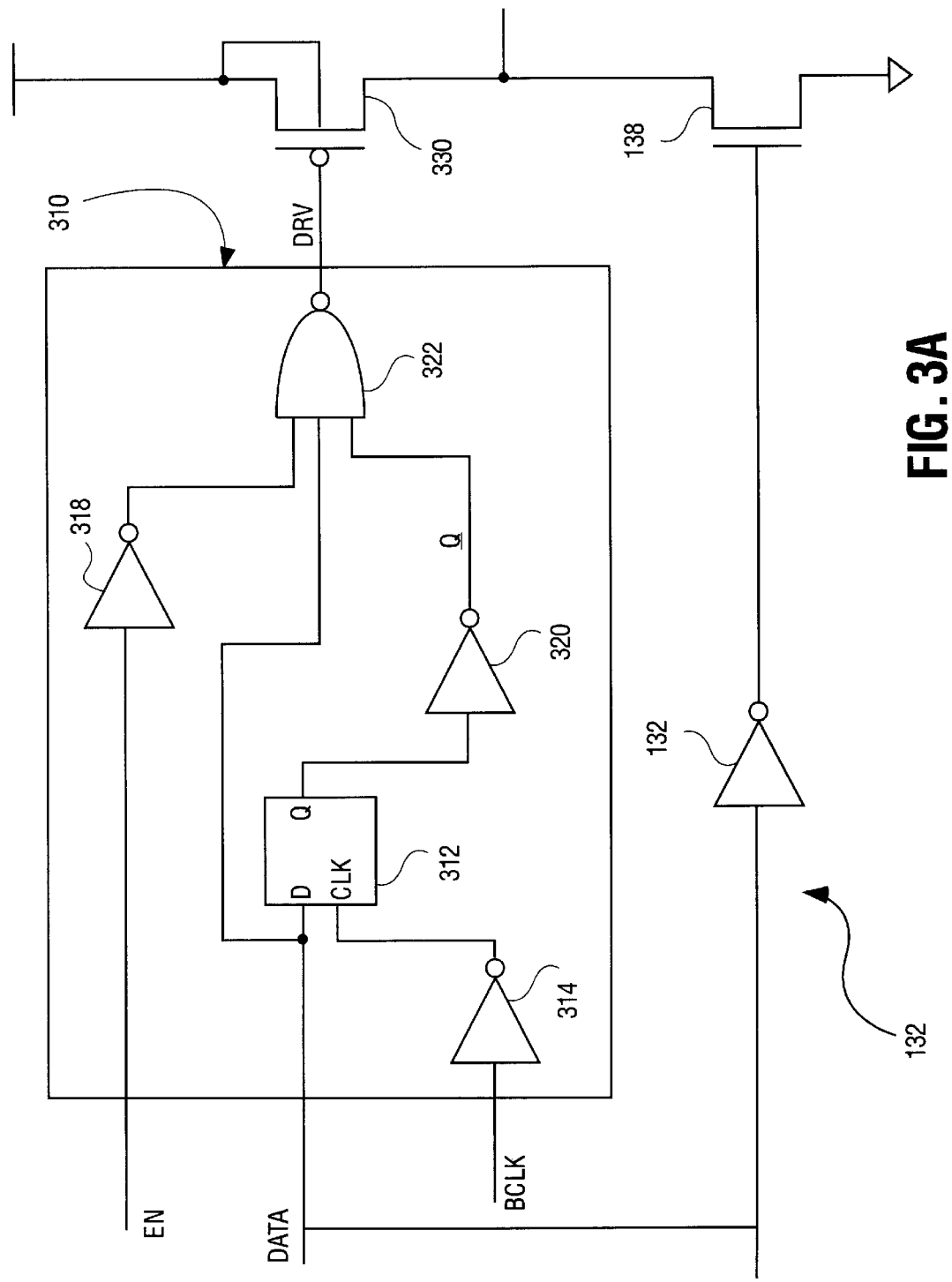
FIG. 3A is a block diagram of a driver circuit, including one embodiment of state machine in accordance with the present invention for detecting voltage transitions in a signal.

Referring now to FIG. 3A, there is shown a block diagram of one embodiment of a driver circuit 300 in accordance with the present invention. Driver circuit 330 is suitable for a device driving a GTL bus, where data transitions are triggered by the rising edge of a bus clock. Modifications for driver circuit 330 for different bus configurations, e.g. active pull-up and transient active pull-down, and signal polarities will be readily apparent to persons skilled in the art having the benefit of this disclosure.

Driver circuit 300 comprises a state machine 310 for detecting low to high voltage transitions, a P-type transistor 330, an inverter 132, and N-type transistor 138. State machine 310 receives a data signal (DATA) from an associated device, such as a processor, and a bus clock signal (BCLK) from a clock source. An output of state machine 310 is coupled to the gate of transistor 330. An output (drain) of transistor 330 is coupled to bus trace 110. State machine 310 includes logic for monitoring DATA and BCLK and asserting a driving signal (DRV) when DATA undergoes a transition from a low voltage state to a high voltage state. In the disclosed embodiment, state machine 310 may be decoupled from transistor 330 by driving enable signal (EN) to a high voltage state (deasserted).

Inverter 132 also receives DATA from the associated device, inverts it and couples it to the gate of transistor 138. The output (drain) of transistor 138 is coupled to bus trace 110. Transistor 138 serves substantially the same function discussed in conjunction with FIG. 1. That is, transistor 138 actively pulls down bus trace 110 when DATA is in a low voltage state.

In the disclosed embodiment of driver circuit 300, state machine 310 includes a latch 312, inverters 314, 318, 320, and a NAND gate 322. A voltage corresponding to the current state of DATA ("DATA(i)") is applied to the data input D of latch 312 and to an input of NAND gate 322. When the voltage at the CLK input of latch 312 is high (BCLK is low), the voltages at D and output Q are the same, i.e. latch 312 is transparent. When the voltage at CLK input is low (BCLK is high), Q is isolated from D. With the voltage at CLK low, any changes to the voltage at D, e.g. changes in the logic state of DATA, will not be reflected at Q until the voltage at CLK goes high again. For example, where DATA changes on the rising edge of BCLK, the voltage at D changes as the voltage at CLK goes low. Provided latch 312 closes, i.e. becomes non-transparent, before the voltage at D reaches its new level, the voltages at D and Q will reflect the state of DATA on two consecutive clock cycles until the voltage it CLK goes high again.

When enabled (EN in a low voltage state), NAND gate 320 samples the current state of DATA directly and samples the state of Q through inverter 320. As noted above, for a period following the transition of DATA, the voltage at Q represents the state of DATA on the previous clock cycle. In particular, when DATA transitions from a low voltage state on one clock cycle (DATA(i–1) on Q is low) to a high voltage state on a subsequent lock cycle (DATA(i) on D is high), the voltage states of the signals driving NAND gate 220 (EN, DATA(i), DATA(i–1)) are all high. NAND gate 320 drives the voltage of DRV to a low voltage state, turning on pull-up transistor 330. DRV remains in the low voltage state until latch 312 becomes transparent, which occurs when CLK next goes to a high voltage state. In short, stale machine 110 detects high going transitions and turns on pull-up transistor 330 by asserting DRV low.

The logic function implemented by state machine 310 for the case where DATA, EN, and DRV are asserted low is:

DRV=DATA(i–1)·<u>DATA(i)</u>·EN.

In this context, an underscore represents the negation of the underscored signal. In the disclosed embodiment, state machine 310 actively pulls bus trace 110 to $V_H$ (DRV low) when EN is low (asserted), DATA(i–1), the DATA signal on the previous BCLK cycle was asserted (in a low voltage state), and DATA(i), the DATA signal on the current BCLK cycle, is not asserted (in a high voltage state).

Figure 4A:
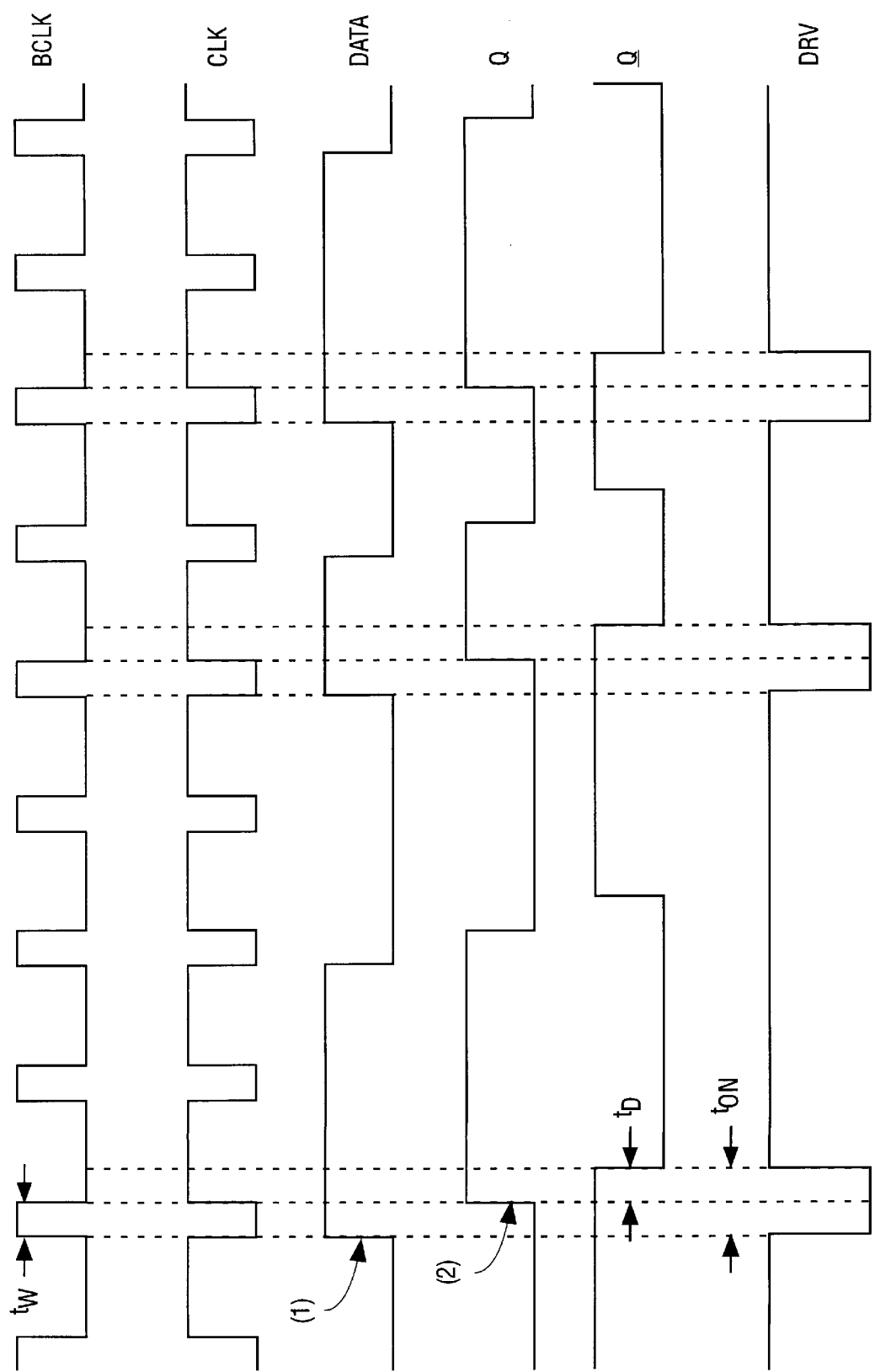
FIG. 4A is a timing diagram for the state machine of FIG. 3A.

Referring now to FIG. 4A, there is shown a timing diagram for the signals of FIG. 3A appropriate for a level triggered latch 312. In this diagram, DATA is shown making transitions, e.g. (1), on the rising edge of BCLK. Following high-going transition (1), the voltage at D is reflected at Q (2) the next time CLK goes high (BCLK goes low). The delay between the time the voltage at D changes and the time this change is reflected at Q is determined by the temporal width ($t_W$) of BCLK and the speed of latch 312 (not indicated). Inverter 320 ensures that NAND gate 322 stops driving DRV low when the voltage at D is latched to Q. A delay between the time Q is updated and the time DRV is deasserted is indicated by $t_D$, which represents the delay in propagating the voltage at Q through inverter 320. This delay may be used to adjust the time, $t_{on}$, for which transistor 330 actively pulls up line 110.

The embodiment of driver circuit 300 in FIG. 3A drives transistor 330 for a duration equal to $t_W$ plus any additional delays attributable to latch 312 and inverter 320 ($t_D$). For example, additional inverter pairs may be added between output Q of latch 312 and the input of NAND gate 322 to increase $t_{ON}$. Alternatively, increasing the duty cycle of BCLK ($t_W/\tau_{BCLK}$) increases $t_{ON}$, where $\tau_{BLCK}$ is the period of BCLK.

Figure 3B:
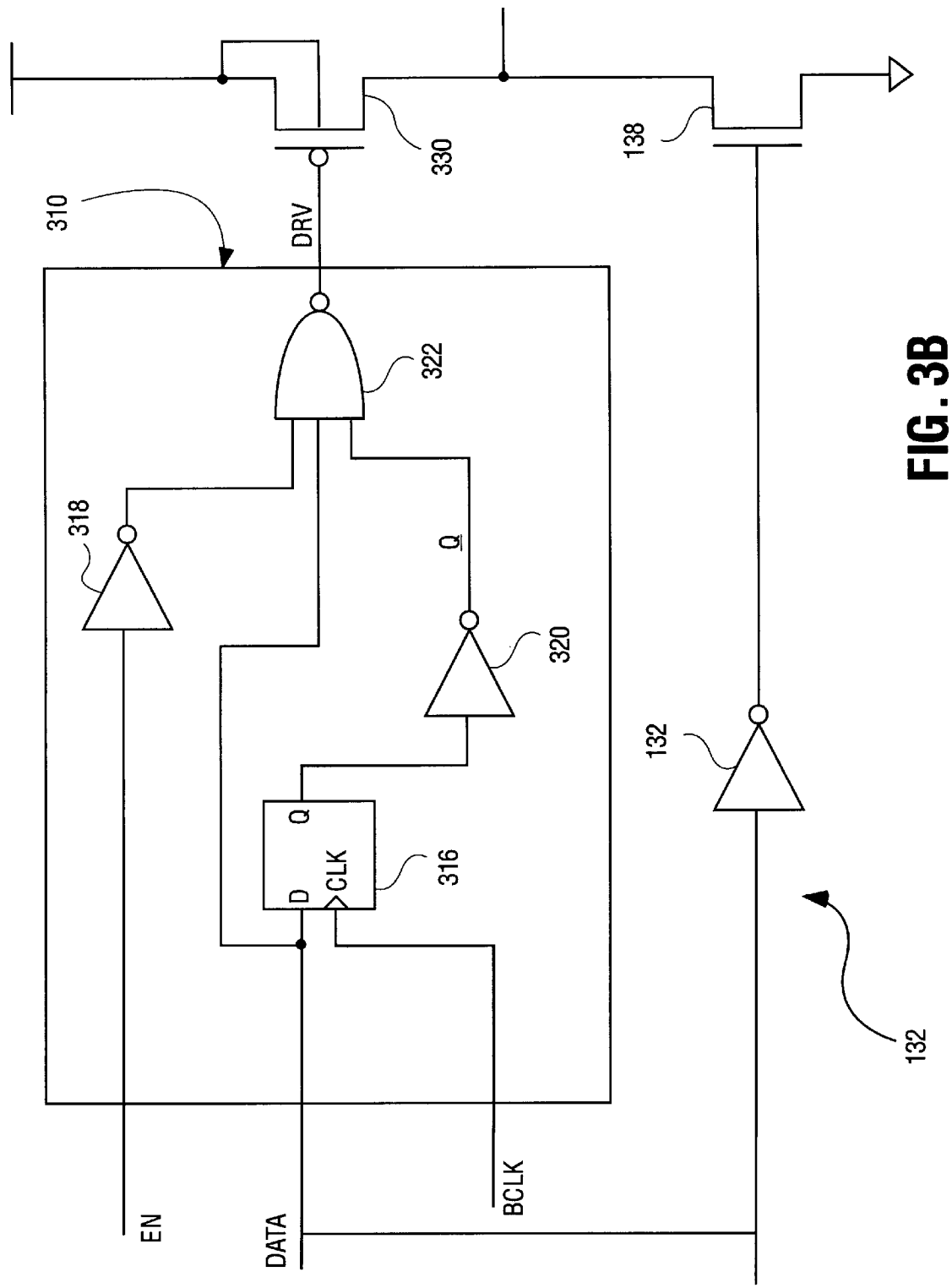
FIG. 3B is a block diagram of a driver circuit including another embodiment of a state machine in accordance with the present invention for detecting voltage transitions in a signal.
Figure 4B:
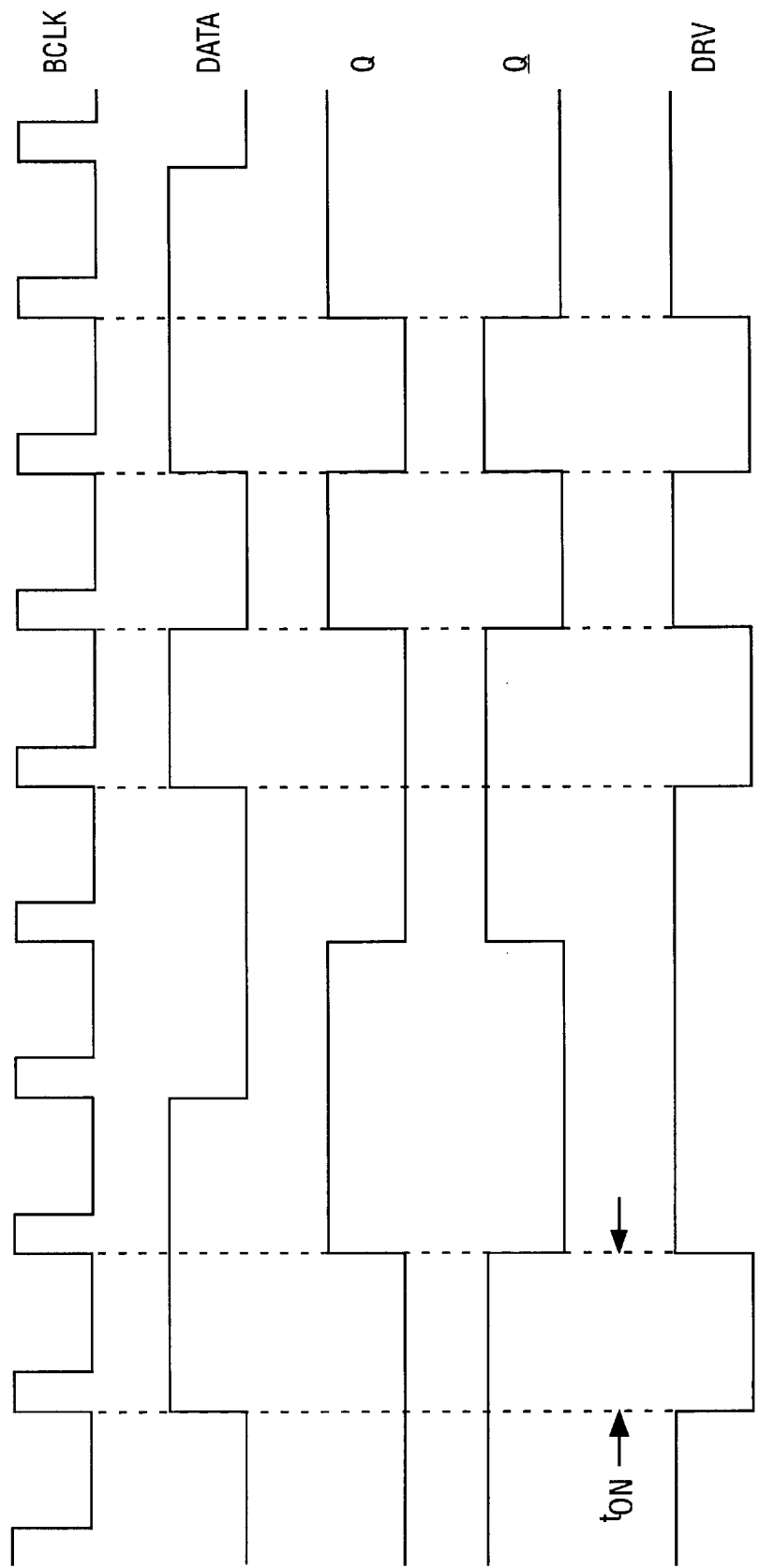
FIG. 4B is a timing diagram for the driver circuit of FIG. 3B.

Referring now to FIG. 3B, there is shown an alternative embodiment of driver circuit 300, in which latch 312 is replaced by a master slave flip flop 316 and BCLK is applied directly to the CLK input of flip-flop 316. In this embodiment of driver circuit 300, the voltage at D transitions on the rising edge of BCLK, and flip flop 316 couples this voltage to Q on the rising edge of the next cycle of BCLK. With this configuration, the voltages at D and Q represent DATA(i) and DATA(i–1) for the intervening BCLK period (ignoring delays). Consequently, transistor 330 is turned on for this period when DATA(i) is high and DATA(i–1) is low, i.e. on low to high transitions. A timing diagram for this embodiment of driver circuit 300 is shown in FIG. 4B As with the embodiment of driver circuit 300 in FIG. 3A, $t_{ON}$ can be increased by adding inverter pairs between flip-flop output Q and NAND gate 322.

FIGS. 3A and 3B represent two embodiments of state machine 310 for detecting low to high transitions of DATA and driving pull-up transistor 330 accordingly. Persons skilled in the art, having the benefit of this disclosure, will recognize additional ways to implement state machine 310 as well as the modifications necessary to detect high to low transitions.

Because bus trace 110 can be driven by multiple devices 130, the time that state machine 310 drives transistor 330 can not be extended indefinitely. Otherwise, bus contention issues arise. This may be understood with reference to multiprocessor based systems, where transactions on the front side bus may be pipelined. Each transaction comprises multiple phases which are handled by corresponding sets of signals. These are request, error, snoop, response and data phases, and their corresponding request, error, snoop, response, and data signal groups, respectively.

The AERR#, HIT#/HITM#, and RNA# signals are processed in the error, snoop, and response phases, respectively. The error phase is two BCLK cycles in duration, while the duration of the snoop and response phases may vary. Because the bus traces corresponding to these signals are shared, bus contention will occur if driver circuit 300 drives transistor 330 longer than the interval between signals on bus trace 110. The bus contention issues raised by driving a GTL bus for both high going and low going transitions may be better understood by reference to a timing diagram for pipelined transactions.

Figure 5:
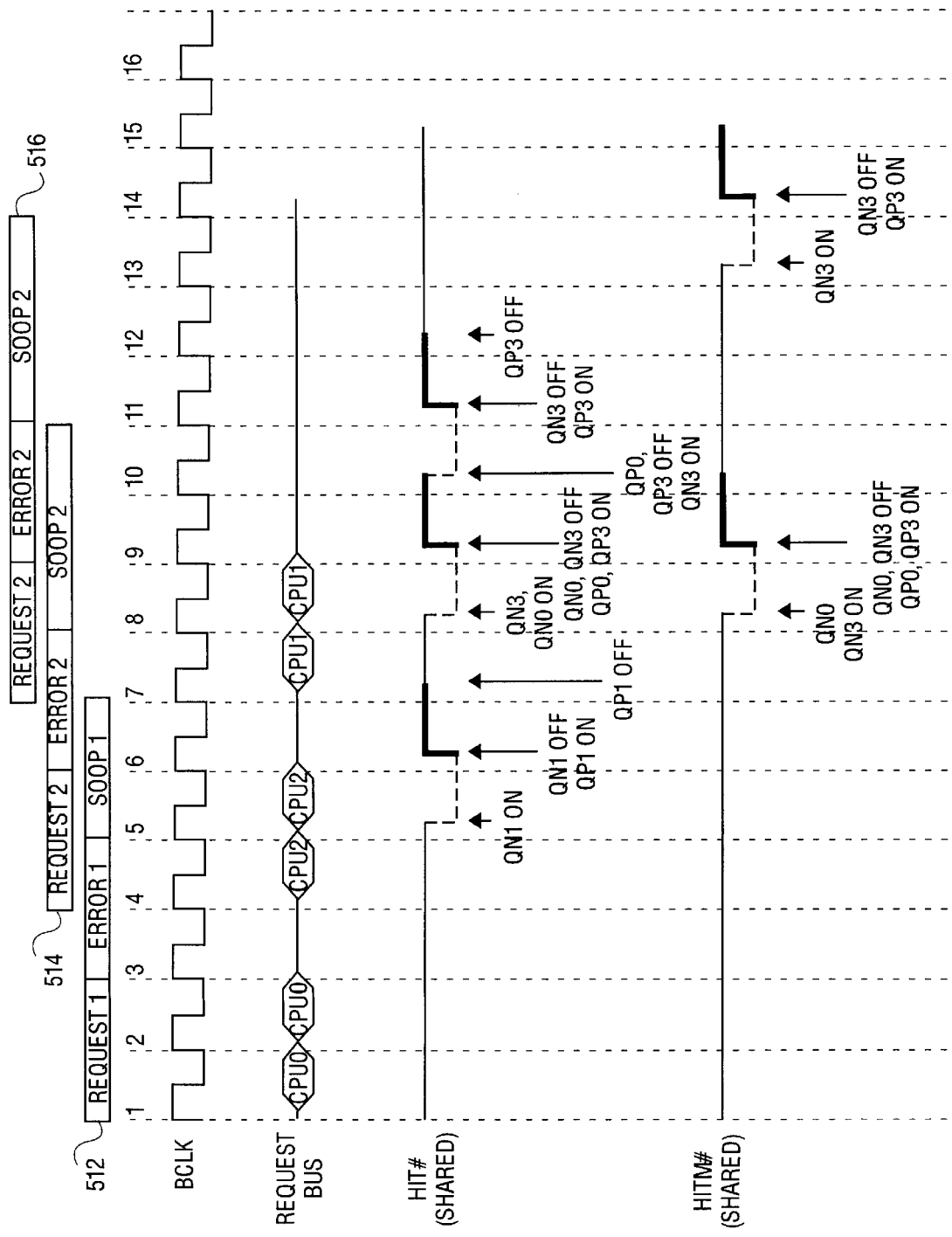
FIG. 5 is a timing diagram for a series of signals generated by the driver circuit of the present invention.

Referring now to FIG. 5, there is shown a timing diagram for a series of pipelined transactions 512, 514, 516 from processors 0, 2, and 1, respectively (CPU0, CPU2, CPU1) on a system incorporating the present invention. To simplify the figure, only the Request Signal Bus from the Request Signal Group and the HIT# and HITM# traces from the Snoop Signal Group are shown. In this embodiment, HIT# and HITM# are signals asserted by snooping agents on the frontside bus to indicate when a memory transaction addresses data stored in its cache. In this discussion, "exclusive", "shared", "modified", and "invalid" refer to the state of cached data in the MESI protocol. This protocol is well know to those skilled in the art and is described for example in *Pentium Pro Architecture System Architecture*, Addison Wesley Developers Press, Reading Mass. (1997) and references cited therein.

HIT# is asserted by an agent when it snoops a memory transaction to an address stored in its cache in the shared or exclusive state. That is, the agent drives transistor 138 on the HIT# bus trace. HITM# is asserted when the agent snoops a memory transaction to an address stored in its cache in the modified state. HIT# and HITM# are both asserted when an agent needs to stall completion of the snoop phase to complete the snoop of its cache. Since HIT# and HITM# are shared signals, they may be asserted simultaneously by more than one agent.

Referring still to FIG. 5, first transaction 512 is initiated at BCLK1 and lasts for two BCLK cycles. Since no error is indicated by assertion of AERR# (not shown), second transaction 514 is initiated at BCLK 4 and also lasts for two BCLK cycles. When agents, e.g. other processors, on the frontside bus snoop transaction 512, agent1 indicates a snoop hit on an exclusive cache line by asserting HIT# at BCLK5 for one clock period. Specifically, driver circuit 300 of agent 1 drives the N-type transistor QN1, e.g. transistor 138, that is coupled to the HIT# bus trace. QN1 is driven for one BCLK cycle, as indicated by the dashed line in FIG. 5. QN1 is turned off following the start of BCLK 6 and QP1 is turned on (bold line) to bring HIT# bus trace 110 back to the high voltage state.

At BCLK8, transaction 514 is snooped and agents 3 and 0 each assert both HIT# and HITM# for one BCLK period to stall the snoop phase while they complete their cache snoops. For example, driver circuit 300 for agent 3 drives the pull down transistors (QN3s) on the HIT# and HITM# bus traces. Following BCLK 9, agents 1 and 3 each turn on their pull up transistors on the HIT# and HITM# bus traces to deassert these signals. One BCLK period later, both agents have completed their snoop cycles, and agent 3 asserts HIT# to indicate a hit on a cache line in the exclusive state. Accordingly, agent 3 turns on QN3 on the HIT# bus while agents 1 and 3 turn off QP1 and QP3, respectively, on the HIT# bus.

Even though agent 3 does not register a snoop hit on transaction 514 consistent with maintaining HIT# deasserted, i.e. in a high voltage state, QP3 must be turned off in case another agent, i.e. agent 0, registers a snoop hit. Bus contention is avoided in BCLK 10 by ensuring that QP1 and QP3 turn off before QN3 turns on. Transactions of this nature impose a limit on the period driver circuit 300 can assert transistor 330 (e.g. QP3) on shared bus traces 110. This is the reason that, for example, a conventional CMOS push pull driver circuit could not be employed with the wired OR front side bus. A CMOS driver for agent 3 would continue driving HIT# as long as agent 3 did not detect a snoop hit.

Figure 6:
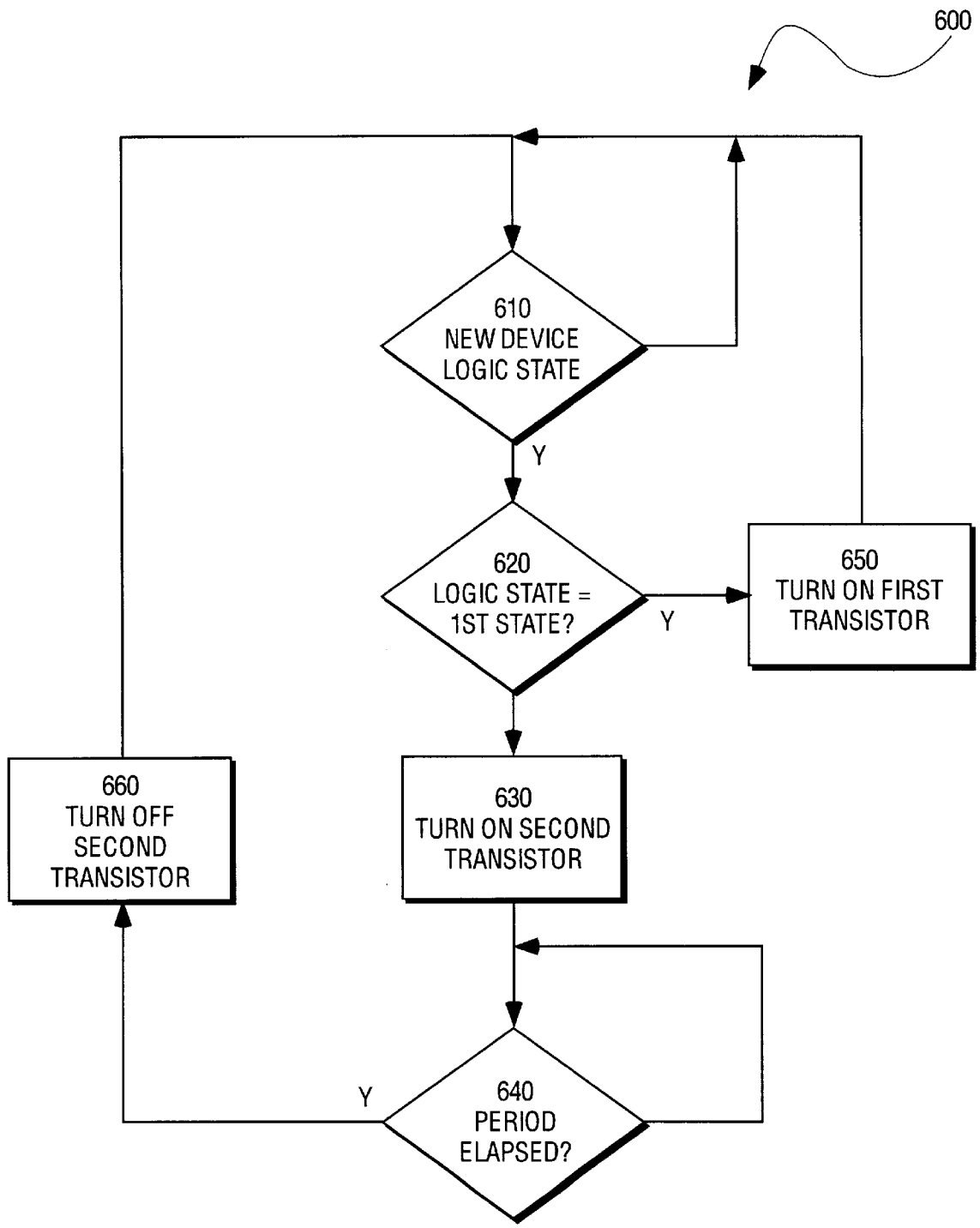
FIG. 6 is a flow chart of a method in accordance with the present invention for actively driving high and low going transitions on a shared bus trace.

Referring now to FIG. 6, there is shown a flow chart of a method 600 in accordance with the present invention for driving a signal on a GTL-type trace. When a new logic state is detected 610, it is determined 620 whether the logic state is a first logic state, e.g. $V_L$, or a second logic state, e.g. $V_H$. When the first logic state is detected, a first transistor is turned on 650 and held on until a new logic state is detected 610. When the second logic state is detected 620, a second transistor is turned on 630. The second transistor remains turned on until a selected period has elapsed 640. When the period elapses 640, the second transistor is turned off 650 and remains off until a new logic state is detected 610.

Referring again to FIG. 1, each device 130 typically has an on-chip voltage that is different from $V_{TT}$. Accordingly, any attempt to modify computer system 100 by adding a pull up transistor, e.g. transistor 330 of FIG. 3, must provide a convenient means for either bringing $V_{TT}$ onto the chip or providing a substitute for $V_{TT}$. One problem with bringing $V_{TT}$ onto devices 130 is that this requires additional I/O pins on the corresponding chips, which raises significant backwards compatibility issues. Alternatively, $V_{TT}$ may be derived from a voltage already available on-chip. However, this requires the addition of substantial circuitry to cover the bus traces handled by driver circuit 300.

In one embodiment of the present invention, system 100 is modified to incorporate driver circuits 300 in accordance with the present invention, and the core voltage available on the devices 130 is used in place of $V_{TT}$. In this embodiment, $V_{TT}$ is nominally 1.5 volts, while the core voltage already available on-chip, $V_{CC}$, is nominally 1.8 volts. Consequently, when transistor 330 is terminated to $V_{CC}$, there is a relatively minor voltage drop of 0.3 V between device 130 and termination points A, B, when transistor 330 is driven. The resulting power dissipation is negligible compared to the power dissipated when transistor 138 is driven by driver circuit 300.

There has thus been disclosed a system and method for driving a signal on a high speed bus without degrading signal quality or causing bus contention. This is accomplished by combining a timed, one-shot active driver for transitions in one direction with a conventional driver circuit for driving transitions in the opposite direction. By driving one transistor with the conventional driver circuit and a complementary transistors with the timed, one-shot active driver for a selected period of time, both positive and negative going transitions have the benefit of active current drive, while the limited driving period of the one shot device eliminates bus contention issues. The driver circuit of the present invention is also backwards compatible with known computer systems that employ open drain buses.

What is claimed is:

1. A method for driving a signal on an open drain bus using first and second transistors having complementary conductivity types, the method comprising:

driving the first transistor to pull a trace of the open drain bus to a first voltage level as long as the signal is in a first logic state;

driving the second transistor for a selected period to pull the trace of the open drain bus to a second voltage level when the signal undergoes a transition from the first logic state to a second logic state, the selected period being determined by a bus clock signal.

2. The method of claim 1, wherein driving the second transistor for a selected period comprises driving the second transistor for a period that is approximately equal to or less than a period of the bus clock signal.

3. The method of claim 2, further comprising ceasing to drive the second transistor when the selected period has elapsed.

4. The method of claim 1, wherein driving the first transistor comprises:

detecting a logic state of the signal during a first time interval;

driving the first transistor when the detected logic state is the first logic state; and storing the detected logic state in a first storage location.

5. The method of claim 4, wherein driving the second transistor comprises:

detecting a logic state of the signal during a second time interval;

driving the second transistor when the logic state detected during the first time interval and the logic state detected during the second time interval are the first and second logic states, respectively.

6. The method of claim 5, further comprising storing the logic state detected during the second time interval in the first storage location.

7. A circuit for driving a device signal on an open drain bus trace, the circuit comprising:

a first transistor having a first conductivity type and coupled to the open drain bus trace;

a second transistor having a second conductivity type complementary to that of the first transistor and coupled to the open drain bus trace;

a driver-circuit having an input to receive the device signal and an output coupled to the first transistor, to drive the first transistor while the first signal is in a first logic state; and a state machine having inputs to receive a bus clock signal and the device signal and an output coupled to the second transistor, the state machine to drive the second transistor for a selected period when the device signal transitions from the first logic state to a second logic state.

8. The circuit of claim 7, wherein the state machine comprises a flip-flop having clock and data inputs and a data output and coupled to store on the data input and data output voltages corresponding to consecutive states of a data signal applied to the data input.

9. The circuit of claim 8, wherein the flip-flop is a latch.

10. The circuit of claim 8, wherein the flip-flop is a master slave flip flop.

11. The circuit of claim 8, further comprising a first inverter having an input coupled to the data output of the flip-flop; and a NAND gate having a first input coupled to the data input of the flip-flop, a second input coupled to an output of the first inverter, and an output coupled to the second transistor, the NAND gate driving the second transistor when the data output of the flip-flop is in a first voltage state and the data input of the flip-flop is in a second voltage state.

12. The circuit of claim 9, further comprising an inverter having an input coupled to receive the bus clock signal and an output coupled to provide an inverted replica of the bus clock signal to the clock input of the latch.

13. A method for driving a shared signal trace, the method comprising:

actively pulling the signal trace to a first voltage level while a first logic state is detected; and actively pulling the signal trace to a second voltage level for a selected time, determined by a bus clock signal, when a second logic state is detected.

14. The method of claim 13, wherein the step of actively pulling the signal to a second voltage comprises:

driving a transistor that couples the signal trace to the second voltage level;

monitoring a bus clock signal; and turning off the transistor when a indicated by the bus clock signal.

15. A circuit for driving a device signal on a GTL-type bus trace, the circuit comprising:

a first transistor coupled between a first reference voltage and the bus trace;

a second transistor complementary to the first transistor and coupled between a second reference voltage and the bus trace;

a buffer having an input to receive the device signal and an output coupled to drive the first transistor when the device signal is in a first voltage state;

a flip-flop having a data input to receive the device signal, a data output, and a clock input, to couple the device signal from the data input to the data output according to a clock signal at the clock input; and a NAND gate having a first input to receive the device signal, a second input coupled to the data output of the flip-flop through an inverter, and an output coupled to drive the second transistor when the device signal transitions from the first voltage state to the second voltage state, until the clock signal couples the data input and output of the flip-flop.

16. The circuit of claim 15, further comprising a buffer to couple an enable signal to a third input of the NAND gate.

17. A computer system comprising:

an open drain bus having a plurality of bus traces;

a plurality of devices, each device capable of generating one or more device signals; and a plurality of device drivers, each device driver associated with one of the devices to couple the associated device to the bus, each device driver to actively drive one of the bus traces to a first voltage state as long as the device signal is in a first logic state and to actively drive the bus trace to a second voltage state an selected interval, when the device signal transitions from the first logic state to a second logic state.

18. The computer system of claim 17, wherein each device driver activates first and second complementary transistors to drive the bus trace to the first and second voltage states, respectively.

19. The computer system of claim 18, wherein each device driver includes a state machine to monitor a clock signal and the device signal and to activate the second transistor when the device signal transitions from the first voltage state to the second voltage state.

20. The computer system of claim 19, wherein the state machine drives the second transistor for an interval related to the monitored clock signal.

21. The computer system of claim 17, wherein any of the plurality of devices can drive the bus trace without first arbitrating for access to the bus trace.

* * * * *